(12) United States Patent
Yu et al.

(10) Patent No.: US 8,939,523 B2
(45) Date of Patent: Jan. 27, 2015

(54) COMPUTER CASE PROTECTING APPARATUS

(71) Applicants: Hong Fu Jin Precision Industry (ShenZhen) Co., Ltd., Shenzhen (CN); Hon Hai Precision Industry Co., Ltd., New Taipei (TW)

(72) Inventors: Xiang Yu, Shenzhen (CN); Xiao-Yong Ma, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/973,708

(22) Filed: Aug. 22, 2013

(65) Prior Publication Data

US 2014/0184045 A1    Jul. 3, 2014

(30) Foreign Application Priority Data

Dec. 28, 2012    (CN) .......................... 2012 1 05825444

(51) Int. Cl.
*A47B 81/00*    (2006.01)
*H05K 5/02*    (2006.01)
*H05K 5/03*    (2006.01)

(52) U.S. Cl.
CPC ................ *H05K 5/0208* (2013.01); *H05K 5/03* (2013.01)
USPC ....................................... 312/223.2; 312/216

(58) Field of Classification Search
CPC ...... G06F 1/181; E05B 65/467; E05B 65/468
USPC ................................................ 312/216, 223.2
See application file for complete search history.

(56) References Cited

U.S. PATENT DOCUMENTS

| | | | | |
|---|---|---|---|---|
| 6,049,451 | A * | 4/2000 | Schmitt et al. ........... | 361/679.33 |
| 6,418,014 | B1 * | 7/2002 | Emerick, Jr. ............. | 361/679.57 |
| 6,581,420 | B1 * | 6/2003 | Ling et al. ........................ | 70/58 |
| 7,661,775 | B2 * | 2/2010 | Sun ............... | 312/216 |
| 7,850,013 | B1 * | 12/2010 | Kramer et al. ................... | 211/4 |
| 8,376,296 | B2 * | 2/2013 | Yu et al. ..................... | 248/213.2 |
| 8,733,853 | B2 * | 5/2014 | Gingrich ....................... | 312/216 |
| 2002/0070640 | A1 * | 6/2002 | Hamilton et al. ........... | 312/107.5 |
| 2008/0211363 | A1 * | 9/2008 | Carter et al. ................. | 312/216 |

* cited by examiner

*Primary Examiner* — Hanh V Tran
(74) *Attorney, Agent, or Firm* — Novak Druce Connolly Bove + Quigg LLP (57) ABSTRACT

A computer case protecting apparatus includes a first mounting band mounted on a computer case, a second mounting band mounted on the computer case, a first protecting cover, and a locking member installed in the first mounting band. A first locating groove is defined in one side of the first mounting band. A second locating groove is defined in one side of the second mounting band. A first restriction hole is defined in the first protecting cover. The locking member comprises a first locking pole and a coupling element. The first protecting cover covers a data port of the computer case by sliding the first protecting cover in the first and the second locating grooves. The first protecting cover is mounted in the first and the second locating grooves by moving the first locking pole into the first restriction hole.

18 Claims, 6 Drawing Sheets

COMPUTER CASE PROTECTING APPARATUS

BACKGROUND

1. Technical Field

The present disclosure relates to a computer case protecting apparatus for protecting data ports of a computer case.

2. Description of Related Art

A typical computer usually includes a number of data ports for transmitting data. The data ports are exposed out of the computer case. An unauthorized person can access the computer to copy data via the data ports easily, which may cause security problems.

Therefore, there is a need for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

FIGS. 1 to 4 show that a computer case protecting apparatus for a computer case 10 includes a first mounting band 20, a second mounting band 30, a first protecting cover 40, a second protecting cover 50, and a locking member 60. The computer case 10 includes a first side plate 11 and a second side plate 12. The first mounting band 20 is mounted on the first side plate 11. The second mounting band 30 is mounted on the second side plate 12. A number of data ports 13 is defined in the computer case 10.

Figure 1:
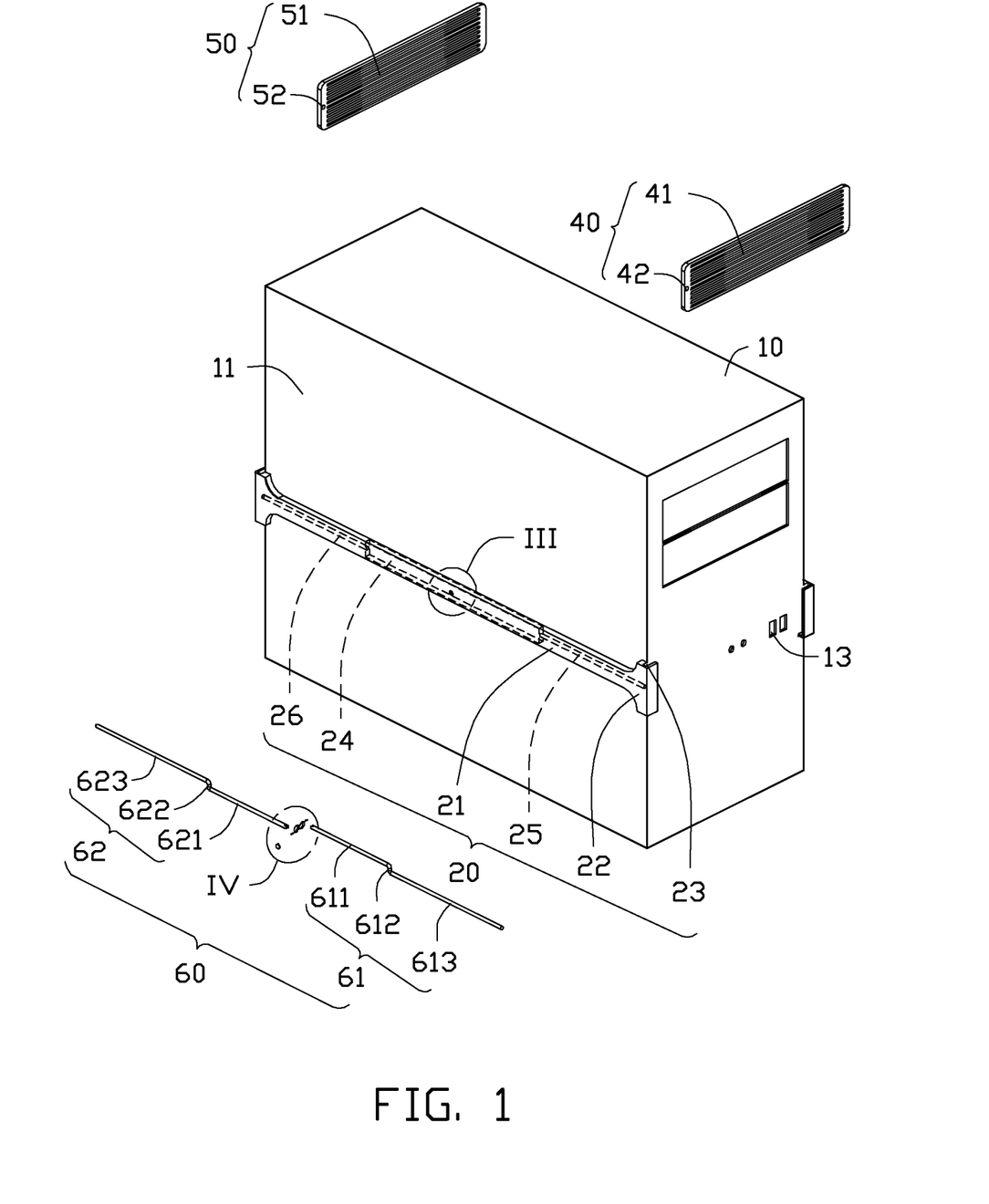
FIG. 1 is an isometric, exploded view of an embodiment of a computer case protecting apparatus.
Figure 2:
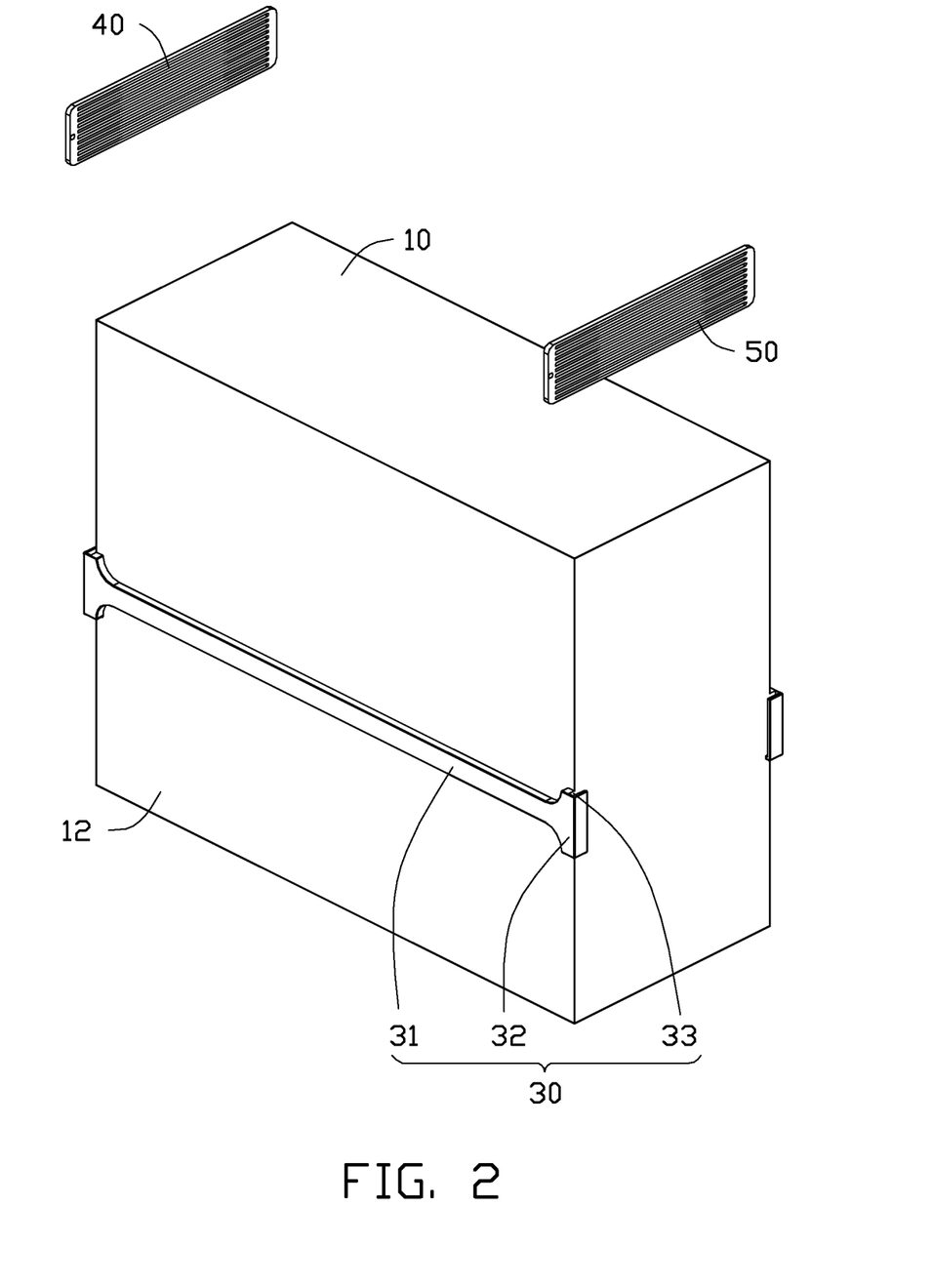
FIG. 2 is a partially assembled view of the computer case protecting apparatus of FIG. 1.
Figure 3:
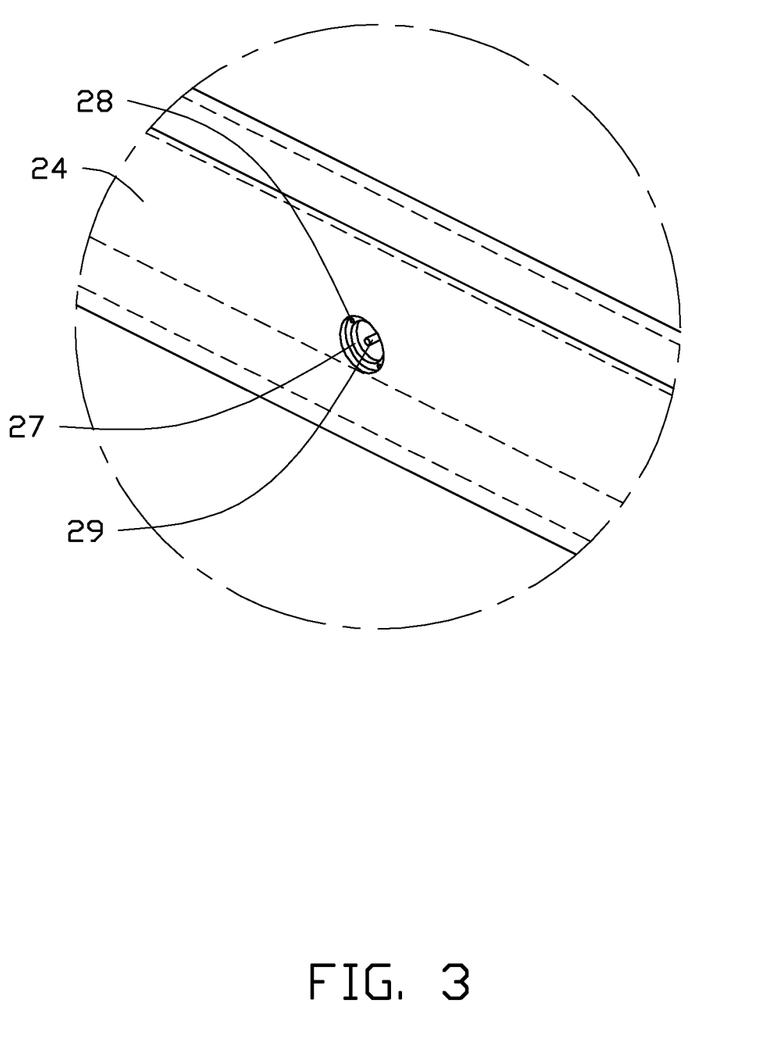
FIG. 3 is an enlarged view of a circled portion III of FIG. 1.
Figure 4:
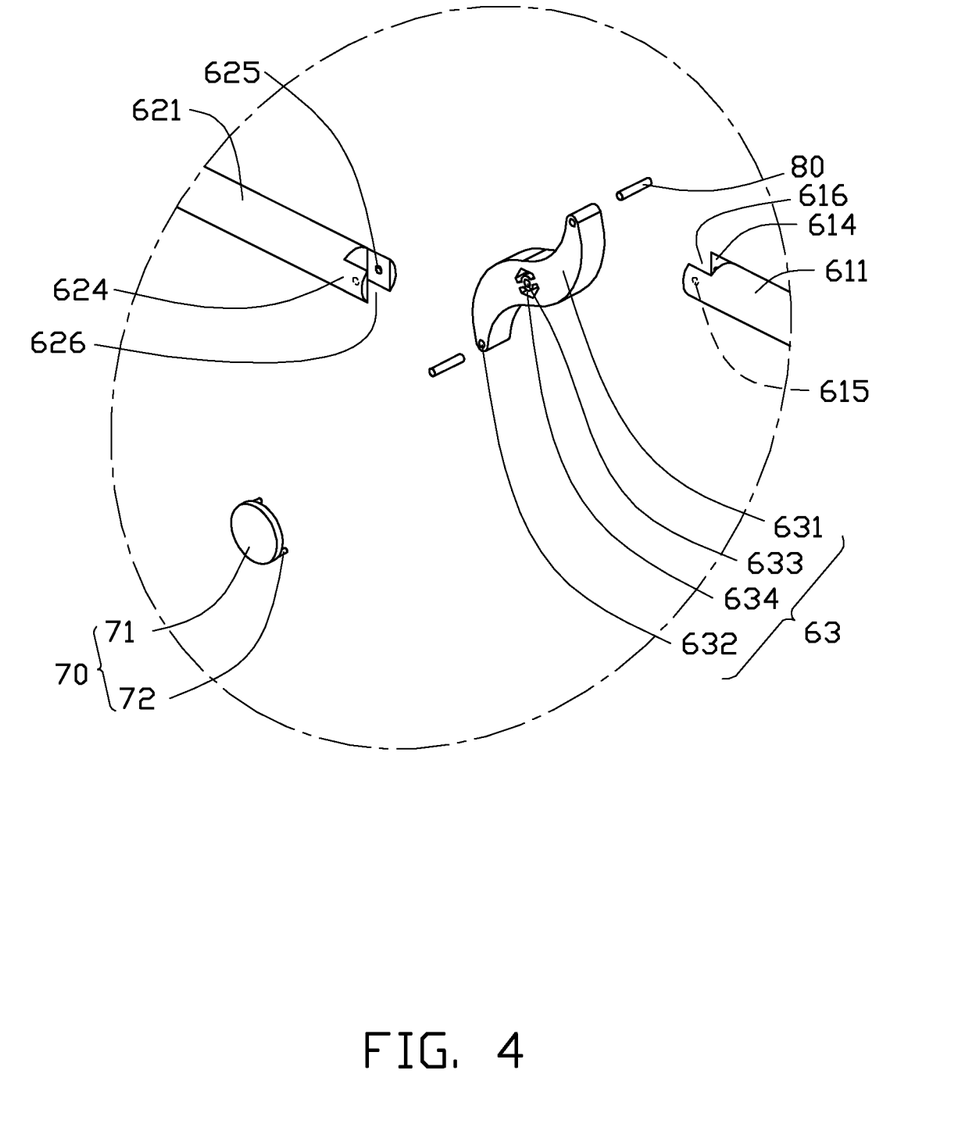
FIG. 4 is an enlarged view of a circled portion IV of FIG. 1.
Figure 5:
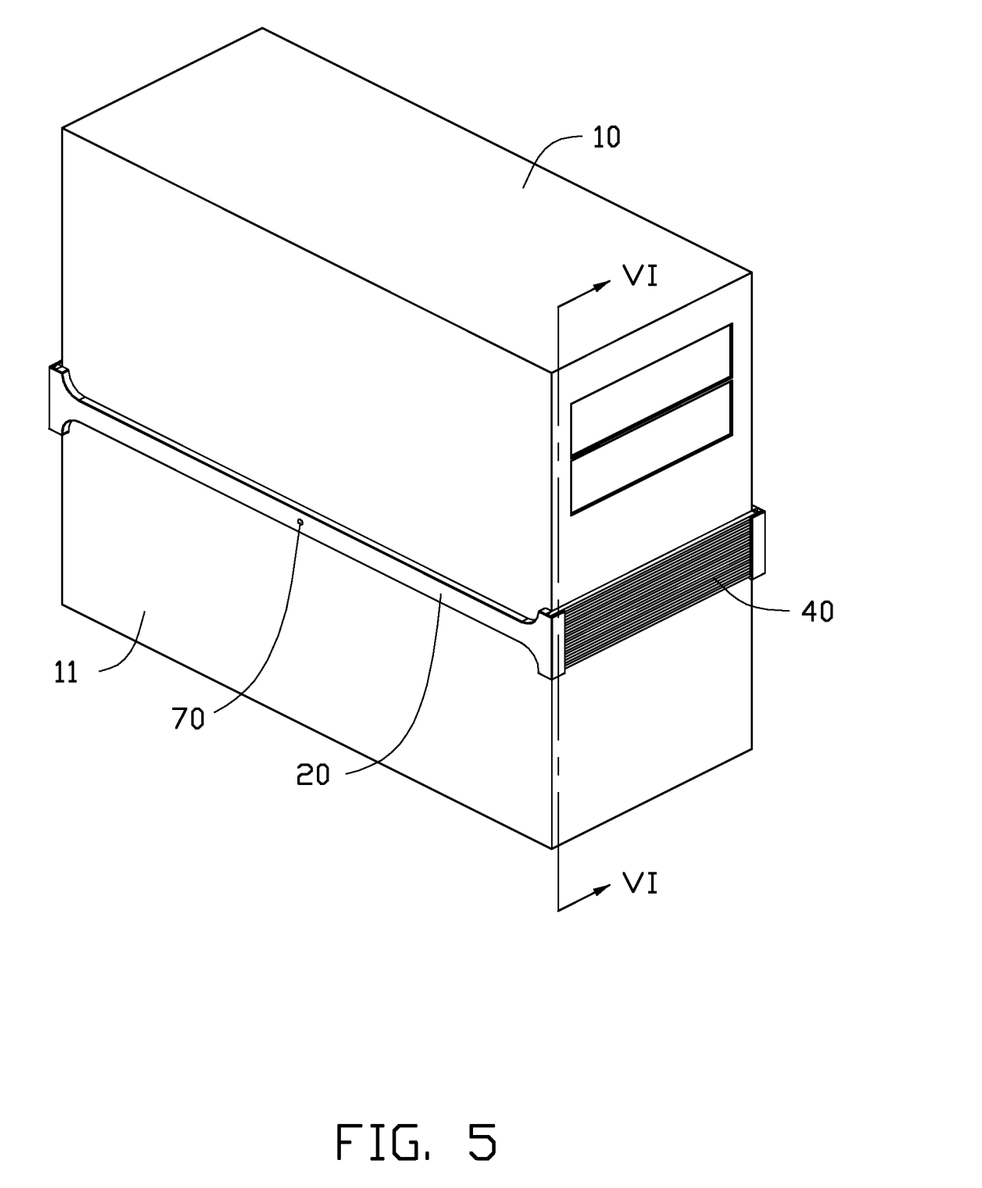
FIG. 5 is an assembled view of the computer case protecting apparatus of FIG. 1.
Figure 6:
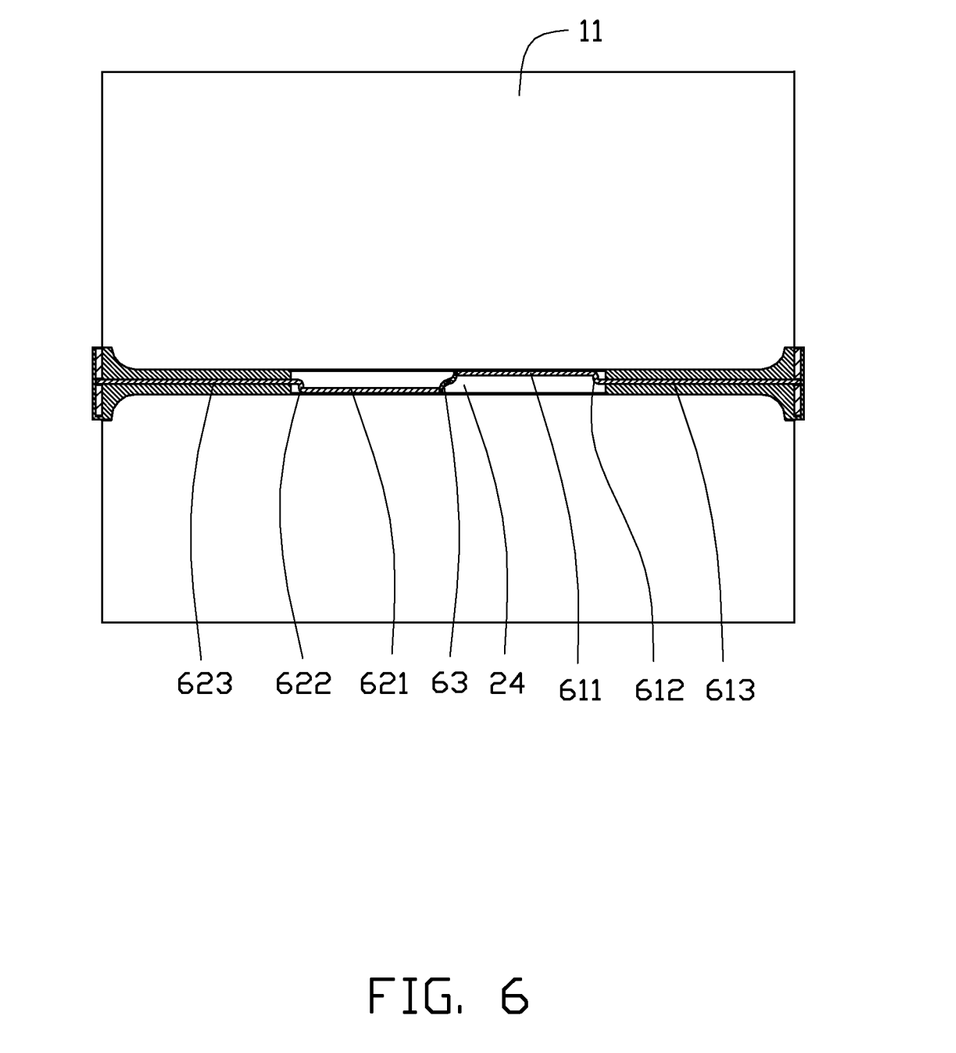
FIG. 6 is a cross-sectional view of the computer case protecting apparatus of FIG. 5, taken along line VI-VI.

The first mounting band 20 includes a first band body 21. A first fixing portion 22 extends from two end of the first band body 21. A first locating groove 23 is defined in each first fixing portion 22. A bar-shaped first fixing groove 24 is defined in the first band body 21. A bar-shaped second fixing groove 25 is defined in the first band body 21 on one side of the first fixing groove 24. A bar-shaped third fixing groove 26 is defined in the first band body 21 on another side of the first fixing groove 24. The first fixing groove 24, the second fixing groove 25, and the third fixing groove 26 communicate with each other. A round inserting hole 27 is defined in the first band body 21. The inserting hole 27 communicates with the first fixing groove 24. A round locating hole 28 is defined in the first band body 21 on two sides of the inserting hole 27. A column-shaped fixing pole 29 extends from the first fixing groove 24 in the first band body 21. The fixing pole 29 extends to outside of the inserting hole 27. In one embodiment, a width of the first fixing groove 24 is greater than a width of the second fixing groove 25 and a width of the third fixing groove 26. Referring to FIG. 4, a shielding plate 70 can be mounted in the inserting hole 27. The shielding plate 70 includes a round shielding body 71. Two column-shaped locating poles 72 extend substantially perpendicularly from the shielding body 71. In one embodiment, a diameter of the inserting hole 27 is equal to a diameter of the shielding body 71, and a diameter of the locating hole 28 is equal to a diameter of the locating poles 72.

The second mounting band 30 includes a second band body 31. A second fixing portion 32 extends from each of two ends of the second band body 31. A second locating groove 33 is defined in each second fixing portion 32.

The first protecting cover 40 includes a first cover body 41. A round first restriction hole 42 is defined in one end of the first cover body 41. The second protecting cover 50 includes a second cover body 51. A round second restriction hole 52 is defined in one end of the second cover body 51.

The locking member 60 includes a first locking pole 61, a second locking pole 62, and a coupling element 63. The first locking pole 61 includes a column-shaped first pivoting portion 611, a first connecting portion 612, and a column-shaped first restriction portion 613. The first connecting portion 612 is connected to the first pivoting portion 611 and the first restriction portion 613. Two first pivoting tabs 614 extend from one end of the first pivoting portion 611. A round first pivoting hole 615 is defined in each of the two first pivoting tabs 614. A first cutout 616 is defined between the two first pivoting tabs 614. In one embodiment, the first pivoting portion 611 is parallel to the first restriction portion 613. A diameter of the first restriction portion 613 is equal to a diameter of the first restriction hole 42.

The second locking pole 62 includes a column-shaped second pivoting portion 621, a second connecting portion 622, and a column-shaped second restriction portion 623. The second connecting portion 622 is connected to the second pivoting portion 621 and the second restriction portion 623. Two second pivoting tabs 624 extend from one end of the second pivoting portion 621. A round second pivoting hole 625 is defined in each of the two second pivoting tabs 624. A second cutout 626 is defined between the two second pivoting tabs 624. In one embodiment, the second pivoting portion 621 is parallel to the second restriction portion 623. An extending direction of the second connecting portion 622 from the second pivoting portion 621 is opposite to an extending direction of the first connecting portion 612 from the first pivoting portion 611. A diameter of the second restriction portion 623 is equal to a diameter of the second restriction hole 52.

The coupling element 63 includes a substantially sigmoid body 631. A round mounting hole 632 is defined in each of two ends of the pole body 631. A round fixing hole 633 is defined in the pole body 631. A locking hole 634 is defined in each of two sides of the fixing hole 633 in the pole body 631. In one embodiment, a diameter of the fixing hole 633 is equal to a cross-sectional area of the fixing pole 29. A diameter of the mounting hole 632 is equal to a diameter of the first pivoting hole 615 and a diameter of the second pivoting hole 625.

FIGS. 1 to 6 show that in assembly, the first restriction portion 613 of the first locking pole 61 is inserted in the second fixing groove 25 of the first mounting band 20, and the second restriction portion 623 of the second locking pole 62 is inserted in the third fixing groove 26 of the first mounting band 20. The first pivoting portion 611, the first connecting portion 612, the second pivoting portion 621, and the second connecting portion 622 are received in the first fixing groove 24. The first pivoting portion 611 abuts against a top of the first fixing groove 24, while the second pivoting portion 621 abuts against a bottom of the first fixing groove 24. The coupling element 63 is located in the first fixing groove 24. The fixing pole 29 of the first fixing groove 24 passes through the fixing hole 633 of the coupling element 63. The first pivoting hole 615 of the first locking pole 61 and the second pivoting hole 625 of the second locking pole 62 are aligned with the mounting holes 632 of the coupling element 63. Two ends of the coupling element 63 are respectively received in the first cutout 616 of the first locking pole 61 and the second cutout 626 of the second locking pole 62. Two fasteners 80 correspondingly pass through the mounting holes 632, the first pivoting holes 615, and the second pivoting holes 625. The coupling element 63 is fixed on the first mounting band 20. The coupling element 63 is pivoted relative to the first locking pole 61 and the second locking pole 62. The first mounting band 20 is mounted on the first side plate 11, while the second mounting band 30 is mounted on the second side plate 12.

In operation, when the number of data ports 13 is not in use, a key (not shown) is inserted in the locking hole 634 of the coupling element 63 via the inserting hole 27 of the first mounting band 20. The key is rotated around a first direction in the inserting hole 27. This causes the coupling element 63 to pull the first locking pole 61 along a third direction in the first fixing groove 24 and the second fixing groove 25, and to pull the second locking pole 62 along a fourth direction in the first fixing groove 24 and the third fixing groove 26. The first protecting cover 40 is slid in the first locating groove 23 of the first mounting band 20 and the second locating groove 33 of the second mounting band 30 from a front of the computer case 10. The second protecting cover 50 is slid in the first locating groove 23 of the first mounting band 20 and the second locating groove 33 of the second mounting band 30 from a back of the computer case 10. The key is rotated around a second direction in the inserting hole 27. This causes the coupling element 63 to push the first locking pole 61 along the fourth direction in the first fixing groove 24 and the second fixing groove 25, and to push the second locking pole 62 along the third direction in the first fixing groove 24 and the third fixing groove 26. The first restriction portion 613 of the first locking pole 61 is moved in the first restriction hole 42 of the first protecting cover 40, and the second restriction portion 623 of the second locking pole 62 is moved in the second restriction hole 52 of the second protecting cover 50. Therefore, the first protecting cover 40 and the second protecting cover 50 are mounted on the computer case 10. The first protecting cover 40 shields the number of data ports 13 in the computer case 10, and unauthorized access of the computer case 10 to copy data via the number of data ports 13 is prevented.

When an authorized user wants to use the number of data ports 13 in the computer case 10, the key is inserted in the locking hole 634 and rotated around the first direction. This causes the first restriction portion 613 of the first locking pole 61 to move out of the first restriction hole 42 of the first protecting cover 40, and causes the second restriction portion 623 of the second locking pole 62 to move out of the second restriction hole 52 of the second protecting cover 50. The first protecting cover 40 and the second protecting cover 50 can be slid out from the corresponding first locating grooves 23 and the second locating grooves 33. Therefore, the number of data ports 13 is not shielded by the first protecting cover 40 and can be used. In one embodiment, the first direction is counter-clockwise, and the second direction is clockwise. The third direction is left, and the fourth direction is right. When the number of data ports 13 is not in use, the locating poles 72 of the shielding plate 70 are inserted in the locating holes 28 of the first mounting band 20. The shielding body 71 shields the inserting hole 27 to prevent dust from falling in the locking hole 634 of the coupling element 63.

Even though numerous characteristics and advantages of the present disclosure have been set forth in the foregoing description, together with details of the structure and function of the disclosure, the disclosure is illustrative only, and changes may be made in detail, especially in the matters of shape, size, and the arrangement of parts within the principles of the disclosure to the full extent indicated by the broad general meaning of the terms in which the appended claims are expressed.

What is claimed is:

1. A computer case protecting apparatus, comprising:
   a first mounting band configured to be mounted on one side of a computer case; a first locating groove being defined in one side of the first mounting band;
   a second mounting band configured to be mounted on another side of the computer case; a second locating groove being defined in one side of the second mounting band;
   a first protecting cover defining a first restriction hole; and
   a locking member installed in the first mounting band; the locking member comprising a first locking pole and a coupling element; wherein the first protecting cover covers a data port of the computer case by sliding the first protecting cover in the first and the second locating grooves; the first protecting cover is mounted in the first and the second locating grooves by moving the first locking pole into the first restriction hole; and when the coupling element is rotated around in a first direction, the coupling element moves the first locking pole toward a third direction, the first locking pole is moved out of the first restriction hole, and the first protecting cover is slid out of the first and the second locating grooves.

2. The computer case protecting apparatus of claim 1, further comprising a second protecting cover; a second restriction hole is defined in the second protecting cover; a first locating groove is defined in another side of the first mounting band; a second locating groove is defined in another side of the second mounting band; the locking member further comprises a second locking pole; and the second locking pole is moved in the second restriction hole to mount the second protecting cover in the first and the second locating grooves.

3. The computer case protecting apparatus of claim 2, wherein when the coupling element is rotated around in the first direction, the coupling element moves the second locking pole toward a fourth direction, the second locking pole is moved out of the second restriction hole, and the second protecting cover is slid out of the first and the second locating grooves.

4. The computer case protecting apparatus of claim 3, wherein the first locking pole comprises a first pivoting portion, a first connecting portion, and a first restriction portion; the first connecting portion is connected to the first pivoting portion and the first restriction portion; two first pivoting tabs extend from one side of the first pivoting portion; a first pivoting hole is defined in each of the two first pivoting tabs; and a first cutout is formed between the two first pivoting tabs.

5. The computer case protecting apparatus of claim 4, wherein the second locking pole comprises a second pivoting portion, a second connecting portion, and a second restriction portion; the second connecting portion is connected to the second pivoting portion and the second restriction portion; two second pivoting tabs extend from one side of the second pivoting portion; a second pivoting hole is defined in each of the two second pivoting tabs; and a second cutout is formed between the two second pivoting tabs.

6. The computer case protecting apparatus of claim 5, wherein the first mounting band comprises a first fixing groove; a second fixing groove is defined in the first mounting band on one side of the first fixing groove; a third fixing groove is defined in the first mounting band on another side of the first fixing groove; the first fixing groove, the second fixing groove, and the third fixing groove are communicating with each other; the first restriction portion is received in the second fixing groove; the second restriction portion is received in the third fixing groove; the first pivoting portion, the first connecting portion, the second pivoting portion, and the second connecting portion are received in the first fixing groove; the first pivoting portion resists against a top of the first fixing groove; and the second pivoting portion resists against a bottom of the first fixing groove.

7. The computer case protecting apparatus of claim 6, wherein the first pivoting portion is parallel to the first restriction portion; the second pivoting portion is parallel to the second restriction portion; and a direction the second connecting portion extending on the second pivoting portion is opposite to a direction that the first connecting portion extends on the first pivoting portion.

8. The computer case protecting apparatus of claim 7, wherein the coupling element comprises two mounting holes and a fixing hole; a locking hole is defined in each of two sides of the fixing hole; a fixing pole extends from the first fixing groove in the first mounting band; the fixing pole passes through the fixing hole; two fasteners pass through the mounting holes, the first pivoting holes, and the second pivoting holes; the coupling element is fixed on the first mounting band; and the coupling element is pivoted relative to the first locking pole and the second locking pole.

9. The computer case protecting apparatus of claim 8, wherein a cross-sectional area of the first restriction portion is equal to a diameter of the first restriction hole; and a cross-sectional area of the second restriction portion is equal to a diameter of the second restriction hole.

10. A computer case protecting apparatus, comprising:
a computer case comprising a first side plate and a second side plate;
a first mounting band configured to be mounted on the first side plate; a first locating groove being defined in one side of the first mounting band;
a second mounting band configured to be mounted on the second side plate; a second locating groove being is defined in one side of the second mounting band;
a first protecting cover defining a first restriction hole; and
a locking member installed in the first mounting band; the locking member comprises a first locking pole and a coupling element; a data port is defined in the computer case; wherein the first protecting cover covers the data port by sliding in the first and the second locating grooves; the first protecting cover is mounted in the first and the second locating grooves by moving the first locking pole into the first restriction hole; and when the coupling element is rotated around in a first direction, the coupling element moves the first locking pole toward a third direction, the first locking pole is moved out of the first restriction hole, and the first protecting cover is slid out of the first and the second locating grooves.

11. The computer case protecting apparatus of claim 10, further comprising a second protecting cover; a second restriction hole is defined in the second protecting cover; a first locating groove is defined in another side of the first mounting band; a second locating groove is defined in another side of the second mounting band; the locking member further comprises a second locking pole; and the second locking pole is moved in the second restriction hole to mount the second protecting cover in the first and the second locating grooves.

12. The computer case protecting apparatus of claim 11, wherein when the coupling element is rotated around in the first direction, the coupling element moves the second locking pole toward a fourth direction, the second locking pole is moved out of the second restriction hole, and the second protecting cover is slid out of the first and the second locating grooves.

13. The computer case protecting apparatus of claim 12, wherein the first locking pole comprises a first pivoting portion, a first connecting portion, and a first restriction portion; the first connecting portion is connected to the first pivoting portion and the first restriction portion; two first pivoting tabs extend from one side of the first pivoting portion; a first pivoting hole is defined in each of the two first pivoting tabs; and a first cutout is formed between the two first pivoting tabs.

14. The computer case protecting apparatus of claim 13, wherein the second locking pole comprises a second pivoting portion, a second connecting portion, and a second restriction portion; the second connecting portion is connected to the second pivoting portion and the second restriction portion; two second pivoting tabs extend from one side of the second pivoting portion; a second pivoting hole is defined in each of the two second pivoting tabs; and a second cutout is formed between the two second pivoting tabs.

15. The computer case protecting apparatus of claim 14, wherein the first mounting band comprises a first fixing groove; a second fixing groove is defined in the first mounting band on one side of the first fixing groove; a third fixing groove is defined in the first mounting band on another side of the first fixing groove; the first fixing groove, the second fixing groove, and the third fixing groove are communicating with each other; the first restriction portion is received in the second fixing groove; the second restriction portion is received in the third fixing groove; the first pivoting portion, the first connecting portion, the second pivoting portion, and the second connecting portion are received in the first fixing groove; the first pivoting portion resists against a top of the first fixing groove; and the second pivoting portion resists against a bottom of the first fixing groove.

16. The computer case protecting apparatus of claim 15, wherein the first pivoting portion is parallel to the first restriction portion; the second pivoting portion is parallel to the second restriction portion; and a direction the second connecting portion extending on the second pivoting portion is opposite to a direction the first connecting portion extending on the first pivoting portion.

17. The computer case protecting apparatus of claim 16, wherein the coupling element comprises two mounting holes and a fixing hole; a locking hole is defined in each of two sides of the fixing hole; a fixing pole extends from the first fixing groove in the first mounting band; the fixing pole passes through the fixing hole; two fasteners pass through the mounting holes, the first pivoting holes, and the second pivoting holes; the coupling element is fixed on the first mounting band; and the coupling element is pivoted relative to the first locking pole and the second locking pole.

18. The computer case protecting apparatus of claim 17, wherein a cross-sectional area of the first restriction portion is equal to a diameter of the first restriction hole; and a cross-sectional area of the second restriction portion is equal to a diameter of the second restriction hole.

\* \* \* \* \*